(12) United States Patent
Zhong et al.

(10) Patent No.: US 8,420,492 B2
(45) Date of Patent: Apr. 16, 2013

(54) MOS TRANSISTOR AND METHOD FOR FORMING THE SAME

(75) Inventors: Huicai Zhong, Beijing (CN); Qingqing Liang, Beijing (CN); Da Yang, Beijing (CN); Chao Zhao, Kessel-lo (BE)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 28 days.

(21) Appl. No.: 13/143,591

(22) PCT Filed: Jan. 27, 2011

(86) PCT No.: PCT/CN2011/070695
§ 371 (c)(1),
(2), (4) Date: Jul. 7, 2011

(87) PCT Pub. No.: WO2012/088779
PCT Pub. Date: May 7, 2012

(65) Prior Publication Data
US 2012/0168829 A1 Jul. 5, 2012

(51) Int. Cl.
*H01L 21/336* (2006.01)
(52) U.S. Cl.
USPC .............. 438/303; 438/304; 257/E21.409
(58) Field of Classification Search .......... 438/301–306; 257/412, E29.255, E21.409
See application file for complete search history.

(56) References Cited

U.S. PATENT DOCUMENTS

| 7,354,838 B2 * | 4/2008 | Kammler et al. ............. 438/303 |
| 7,488,659 B2 * | 2/2009 | Dyer ............................. 438/296 |
| 2005/0145894 A1 | 7/2005 | Chau |

FOREIGN PATENT DOCUMENTS

| CN | 1846313 | 10/2006 |
| CN | 1902740 | 1/2007 |
| CN | 101276758 | 10/2008 |
| CN | 100517754 | 7/2009 |
| JP | 2009246381 | 10/2009 |

OTHER PUBLICATIONS

PCT International Search Report and Written Opinion of the International Searching Authority, dated Oct. 13, 2011, PCT Patent Application No. PCT/CN2011/070695.
English Abstract of Chinese Patent No. CN1846313.
English Abstract of Chinese Patent Application No. CN1902740.
English Abstract of Chinese Patent Application No. CN100517754.
English Abstract of Chinese Patent Application No. CN101276758.
English Abstract of Japanese Patent Application No. JP2009246381.

* cited by examiner

*Primary Examiner* — Brook Kebede
(74) *Attorney, Agent, or Firm* — Vierra Magen Marcus LLP

(57) ABSTRACT

The invention provides a MOS transistor and a method for forming the MOS transistor. The MOS transistor includes a semiconductor substrate; a gate stack on the semiconductor substrate, and including a gate dielectric layer and a gate electrode on the semiconductor substrate in sequence; a source region and a drain region, respectively at sidewalls of the gate stack sidewalls of the gate stack and in the semiconductor; sacrificial metal spacers on sidewalls of the gate stack sidewalls of the gate stack, and having tensile stress or compressive stress. This invention scales down the equivalent oxide thickness, improves uniformity of device performance, raises carrier mobility and promotes device performance.

23 Claims, 6 Drawing Sheets

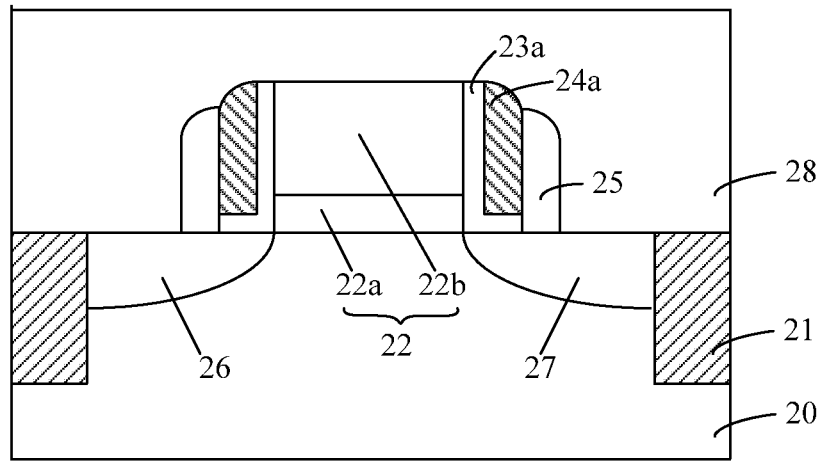

FIG. 9

| providing a semiconductor substrate with a dielectric layer thereon, the dielectric layer defining an opening therein for exposing the semiconductor substrate on a bottom thereof, a source region and a drain region being respectively formed on the semiconductor substrate and at both sides of the opening | S31 |

↓

| forming sacrificial metal spacers on both sides of the opening, the sacrificial metal spacers having tensile stress or compressive stress | S32 |

↓

| forming a gate dielectric layer for covering the sacrificial metal spacers, and the semiconductor substrate which is exposed at the bottom of the opening | S33 |

↓

| filling a gate electrode in the opening | S34 |

FIG. 10

MOS TRANSISTOR AND METHOD FOR FORMING THE SAME

CROSS REFERENCE TO RELATED APPLICATIONS

The present application is a Section 371 National Stage Application of International Application No. PCT/CN2011/070695, filed on Jan. 27, 2011, which claims the benefit of CN 201010618284.2, filed on Dec. 31, 2010, the entire disclosure of which are incorporated herein by reference in their entirety.

FIELD OF THE INVENTION

The present invention relates to semiconductor device and semiconductor manufacture, and particularly to a MOS transistor and a method for forming the same.

BACKGROUND OF THE INVENTION

Manufacture process of MOS transistors typically comprises Gate-First process and Gate-Last process. A gate stack combines metal gate electrode, and gate dielectric layer of high-dielectric-constant (high-k) material which has a low Equivalent Oxide Thickness (EOT), and is widely employed at the technology node of 32 nm and beyond.

An interface oxide layer, 4 Å or so in thickness, normally occurs between a gate dielectric layer of high-k material and a semiconductor substrate by virtue of natural oxidation. And it is difficult to scale down the equivalent oxide thickness of the gate dielectric layer of the MOS transistor to 1 nm, in which high-k material is combined with a metal gate, hindering miniature tendency of a semiconductor device.

In order to scale down the equivalent oxide thickness of the gate stack, according to prior art, a sacrificial metal layer between a gate dielectric layer, which is made of high-k material, and a metal gate electrode, is provided to remove oxygen in the interface oxide layer. Material of the sacrificial metal layer is generally Ti, Ta or the like.

FIG. 1 is a schematic cross-section view of a conventional MOS transistor. As shown in FIG. 1, the conventional MOS transistor comprises a semiconductor substrate 10; an isolation structure 11 formed in the semiconductor substrate 10; a gate stack 12 formed on the semiconductor substrate 10; and a source region 13 and a drain region 14 are respectively formed on sidewalls of the gate stack 12. The isolation structure 11 comprises shallow trench isolation (STI) structure. The gate stack 12 includes a gate dielectric layer 12a, a sacrificial metal layer 12b and a gate electrode 12c, which are formed in sequence on the semiconductor substrate 10. Material of the gate dielectric layer 12a is high-k material, material of the sacrificial metal layer 12b is Ti, Ta and the like, and material of the gate electrode 12c is metal and conductive material. An interface oxide layer 10a is provided on a surface of the semiconductor substrate 10 and below the gate dielectric 12a. After annealing and other thermal processes, the sacrificial metal layer 12b absorbs and removes oxygen in the interface oxide layer 10a and the gate dielectric layer 12a, thereby lowering the equivalent oxide thickness of the gate stack of the overall MOS transistor.

However, according to the above method, the sacrificial metal layer 12b absorbs and removes the oxygen and is converted into a metal oxide serving as a dielectric material, and thus has to be regarded as part of the equivalent oxide thickness of the gate stack of the overall MOS transistor, increasing the equivalent oxide thickness. In addition, the sacrificial metal layer 12b may not be converted into a metal oxide completely. For instance, the oxygen in the interface oxide layer 10a is insufficient to convert the sacrificial metal layer 12b to an insulating metal oxide, resulting in different work function and equivalent oxide thickness of different devices, and correspondingly deteriorating uniformity of performance parameters, such as threshold voltage, of different devices. The MOS transistor will not have stress by the above method, and thus the device performance, for instance carrier mobility, can not be raised.

SUMMARY OF THE INVENTION

A technical problem solved by the invention is to effectively reduce equivalent oxide thickness, address deterioration of uniformity of device performance, and raise device performance.

To achieve the object, the invention provides a MOS transistor, comprising:
a semiconductor substrate;
a gate stack located on the semiconductor substrate, and including a gate dielectric layer and a gate electrode arrayed on the semiconductor substrate in sequence;
a source region and a drain region, located in the semiconductor substrate and at sidewalls of the gate stack; and
sacrificial metal spacers located on sidewalls of the gate stack, and having tensile stress or compressive stress.

Optionally, the MOS transistor comprises NMOS transistor, and the sacrificial metal spacers have tensile stress.

Optionally, material of the sacrificial metal spacers comprises aluminum, chromium, zirconium, aluminum oxide, chromium oxide or zirconium oxide.

Optionally, the MOS transistor comprises PMOS transistor, and the sacrificial metal spacers have compressive stress.

Optionally, material of the sacrificial metal spacers comprises aluminum, tantalum, zirconium, aluminum oxide, tantalum oxide or zirconium oxide.

Optionally, the MOS transistor further comprises L-shaped spacers located between the sacrificial metal spacers and the gate stack and between the sacrificial metal spacers and the semiconductor substrate.

Optionally, the MOS transistor further comprises:
dielectric spacers located on outer sidewalls of the sacrificial metal spacers on the semiconductor substrate.

Optionally, the MOS transistor further comprises:
L-shaped spacers located between the dielectric spacers and the sacrificial metal spacers and between the sacrificial metal spacers and the semiconductor substrate.

To overcome the above problem, a method for forming MOS transistor comprises:
providing a semiconductor substrate;
forming a gate stack on the semiconductor substrate, and the gate stack including a gate dielectric layer and a gate electrode arrayed on the semiconductor substrate in sequence;
forming sacrificial metal spacers on sidewalls of the gate stack, and the gate stack having tensile stress or compressive stress; and
forming a source region and a drain region, respectively at opposite sides of the gate stack on the semiconductor substrate.

Optionally, forming sacrificial metal spacers on sidewalls of the gate stack comprises:
forming a metal layer for covering a surface of the semiconductor substrate, and a surface and sidewalls of the gate stack; and
anisotropically etching the metal layer, removing a part of the metal layer, which are on a surface of the semiconductor substrate and a surface of the gate stack, for forming the sacrificial metal spacers on sidewalls of the gate stack.

Optionally, the method further comprises: before forming the metal layer, forming an isolation dielectric layer for covering a surface of the semiconductor substrate and a surface and sidewalls of the gate stack, the metal layer being located above the isolation dielectric layer; and after anisotropically etching the metal layer, anisotropically etching the isolation dielectric layer, and removing the isolation dielectric layer on a surface of the gate stack and a surface of the semiconductor substrate for forming L-shaped spacers between the sacrificial metal spacers and the gate stack with the semiconductor substrate.

Optionally, the MOS transistor comprises NMOS transistor, and the metal layer has tensile stress.

Optionally, material of the sacrificial metal spacers comprises aluminum, chromium or zirconium.

Optionally, the MOS transistor comprises PMOS transistor, and the metal layer has compressive stress.

Optionally, material of the sacrificial metal spacers comprises aluminum, tantalum or zirconium.

Optionally, after forming the sacrificial metal spacers and before forming the source region and drain region,
forming dielectric spacers on outer sidewalls of the sacrificial metal spacers on the semiconductor substrate.

The invention further provides a method for forming a semiconductor device, comprising:

providing a semiconductor substrate with a dielectric layer thereon, the dielectric layer defining an opening therein for exposing the semiconductor substrate on a bottom thereof, a source region and a drain region being respectively formed on the semiconductor substrate and at both sides of the opening;

forming sacrificial metal spacers on both sides of the opening, the sacrificial metal spacers having tensile stress or compressive stress;

forming a gate dielectric layer for covering the sacrificial metal spacers, and the semiconductor substrate which is exposed at the bottom of the opening; and filling a gate electrode in the opening.

Optionally, forming sacrificial metal spacers on both sides of the opening, comprising: forming a metal layer for covering a surface of the dielectric layer, and a bottom and sidewalls of the opening;
anisotropically etching the metal layer, removing a part of the metal layer on a surface of the dielectric layer and the bottom of the opening for forming the sacrificial metal spacers on sidewalls of the gate stack.

Optionally, the MOS transistor comprises NMOS transistor, and the metal layer has tensile stress.

Optionally, material of the sacrificial metal spacers comprises aluminum, chromium or zirconium.

Optionally, the MOS transistor comprises PMOS transistor, and the metal layer has compressive stress.

Optionally, material of the sacrificial metal spacers comprises aluminum, tantalum or zirconium.

Optionally, the method further comprises: before forming the metal layer,
forming an isolation dielectric layer for covering a surface of the dielectric layer, and sidewalls and a bottom of the opening, the metal layer being formed on the isolation dielectric layer; and
after anisotropically etching the metal layer for forming the sacrificial metal spacers, etching the isolation dielectric layer, and removing the isolation dielectric layer on a surface of the dielectric layer and on a bottom of the opening for forming L-shaped spacers between the sacrificial metal spacers and the dielectric layer with the semiconductor substrate.

Compared with the prior art, the invention has the advantages below.

Sacrificial metal spacers are formed on sidewalls of the gate stack to absorb oxygen of the gate stack, thereby obviating the problems in prior art, for example, increasing the equivalent oxide thickness and deteriorating uniformity of device performance. The sacrificial metal spacers have stress for promoting carrier mobility of MOS transistor and improving device performance.

Further, the invention is adapted for both gate-first process and gate-last process, and therefore facilitates process integration and promotes industrial applicability.

BRIEF DESCRIPTION OF THE DRAWINGS

FIGS. 3-9 are cross-sectional views of intermediate structure of the MOS transistor according to a method for forming a MOS transistor of the first embodiment of the present invention;

FIG. 10 is a flow chart of the method for forming a MOS transistor according to the second embodiment of the present invention;

DETAILED DESCRIPTION OF THE EMBODIMENTS

In a conventional MOS transistor, in order to achieve relatively small equivalent oxide thickness, a sacrificial metal layer is provided between a gate dielectric layer and a gate electrode to absorb and remove oxygen in an interface oxide layer and the gate dielectric layer. However, the sacrificial metal layer absorbs oxygen so as to be oxidized as a metal oxide dielectric layer, increasing the equivalent oxide thickness and impacting on work function of the MOS transistor.

According to one embodiment of the present invention, sacrificial metal spacers are formed on sidewalls of the gate stack to absorb oxygen of the gate stack, thereby obviating the problems in prior art, for example, increase of the equivalent oxide thickness and deterioration of uniformity of device performance. In addition, the sacrificial metal spacers have stress for promoting carrier mobility of MOS transistor and improving device performance.

Further, the invention is adapted for both gate-first process and gate-last process, and therefore facilitates process integration and promotes industrial applicability.

In order to clarify the objects, characteristics and advantages of the invention, embodiments of the invention will be interpreted in detail in combination with accompanied drawings.

More examples are provided hereinafter to describe the invention. However, it shall be appreciated by those skilled in the art that alternative ways may be made without deviation from the scope of the invention. Therefore the invention is not limited within the embodiments described here.

Figure 1:
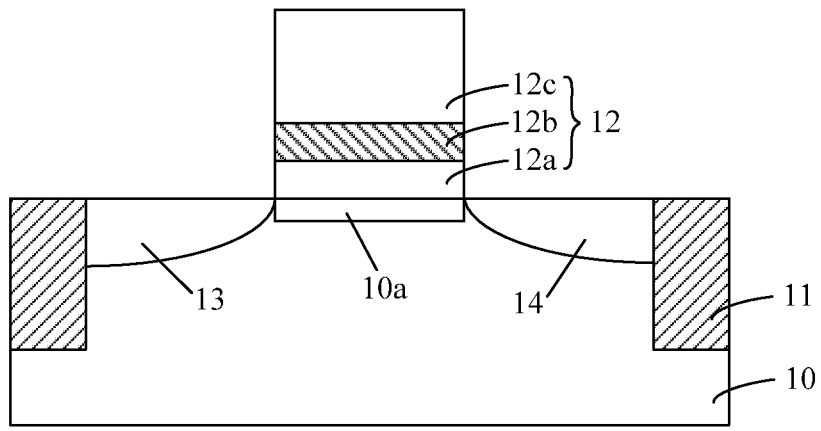
FIG. 1 is a cross-sectional view of a conventional MOS transistor.
Figure 2:
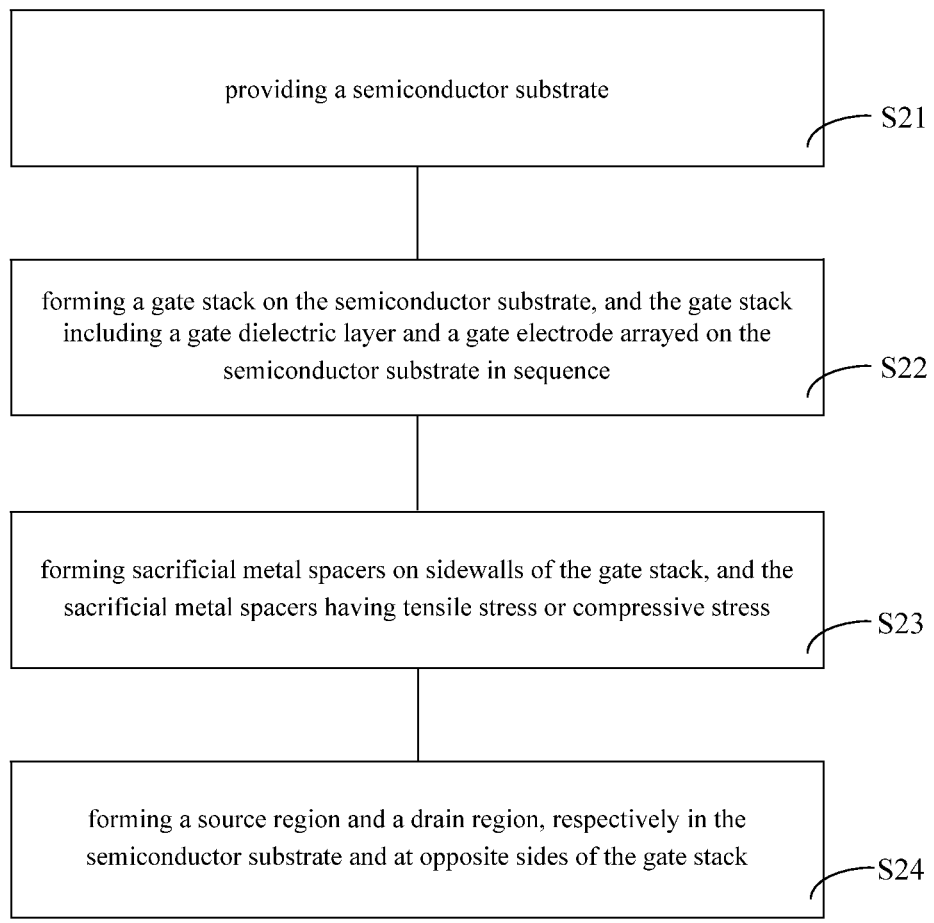
FIG. 2 schematically shows a method for forming a MOS transistor according to a first embodiment of the present invention.

FIG. 2 schematically shows a method for forming a MOS transistor according to a first embodiment of the present invention, which comprises gate-first process. As shown in FIG. 2, the method comprises:

Step S21, providing a semiconductor substrate;

Step S22, forming a gate stack on the semiconductor substrate, the gate stack comprising a gate dielectric layer and a gate electrode arrayed on the semiconductor substrate in sequence;

Step S23, forming sacrificial metal spacers on sidewalls of the gate stack, the sacrificial metal spacers having tensile stress or compressive stress;

Step S24, forming a source region and a drain region respectively on opposite sides of the gate stack.

FIGS. 3-9 are cross-sectional views of intermediate structure of the MOS transistor according to a method for forming a MOS transistor of the first embodiment of the present invention.

Figure 3:

In combination with FIGS. 2 and 3, the step S21 is performed. A semiconductor substrate is provided. Specifically, as shown in FIG. 3, a semiconductor substrate 20 is provided, which may be made of a silicon substrate, a silicon germanium substrate, a III-V group compound substrate, a silicon carbide substrate or a laminated structure thereof, a silicon on insulator, a diamond substrate, or any other semiconductor substrates known to those skilled in the art. In one embodiment, the semiconductor substrate 20 is a silicon substrate with isolation structures 21 therein. The isolation structures 21 may be shallow trench isolation structures, or any other structures for isolating devices or active regions, which are well known to those skilled in the art.

Figure 4:
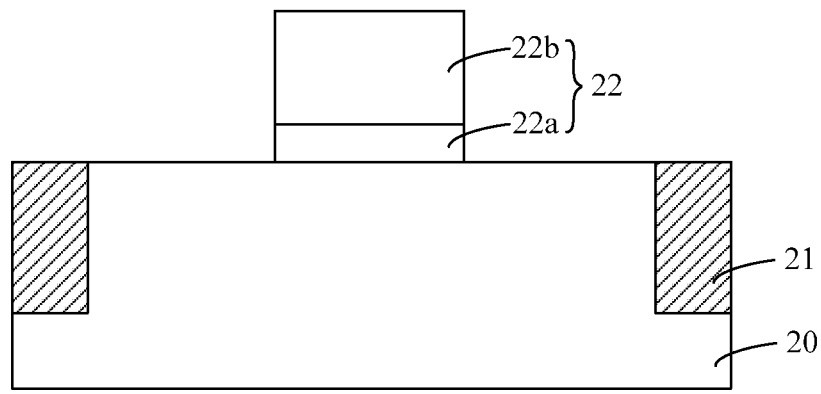

Referring to FIGS. 2 and 4, the step S22 is performed. A gate stack is formed on the semiconductor substrate, and comprises a gate dielectric layer and a gate electrode arrayed on the semiconductor substrate in sequence. In a specific embodiment, a gate stack 22 is formed on a surface of the semiconductor substrate 20, and comprises a gate dielectric layer 22a and a gate electrode 22b arrayed on the semiconductor substrate in sequence. In the embodiment, material of the gate dielectric layer 22a is high K material, for example, $HfO_2$, $ZrO_2$, $La_2O_3$, or other high K material well known to those skilled in the art. Material of the gate electrode 22b is metal or other conductive material, for example, Ti, Ni, Al, W or other conductive material which can be used as gate electrode and is well known to those skilled in the art.

It should be noted that, due to natural oxidation, an interface oxide layer (not shown) is formed between the gate dielectric layer 22a and the semiconductor substrate 20, including a part on a lower surface of the gate dielectric layer 22a, and another part on an upper surface of the semiconductor substrate 20.

Figure 5:
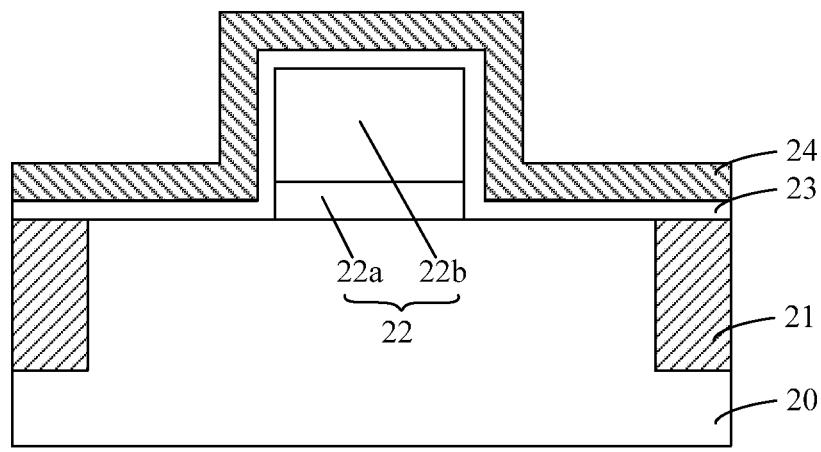
Figure 6:
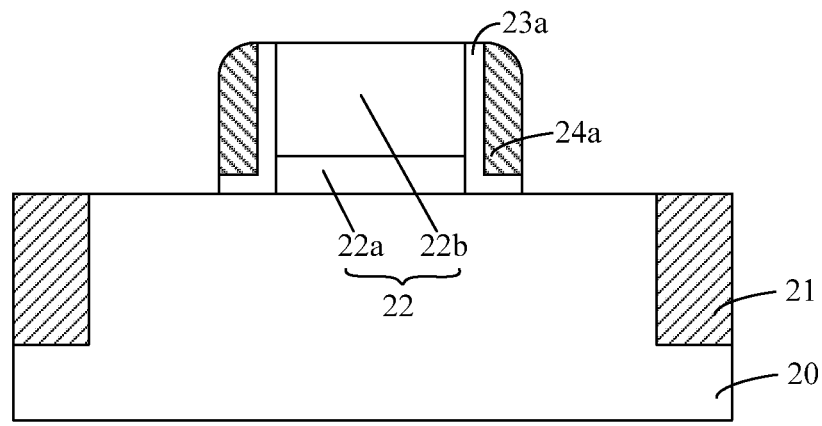

Referring to FIGS. 2, 5 and 6, the step S23 is performed. Sacrificial metal spacers are formed on side walls of the gate stack, and have tensile stress or compressive stress.

Specifically, referring to FIG. 5, an isolation dielectric layer 23 and a metal layer 24 are respectively formed on a surface of the semiconductor substrate 20, surfaces and side walls of the gate stack 22 in sequence. The metal layer 24 has tensile stress or compressive stress. Material of the isolation dielectric layer 23 comprises silicon oxide, silicon nitride or combination thereof. According to different types of the MOS transistors, for example, as for an NMOS transistor, the metal layer 24 has tensile stress, and has material of aluminum, chromium or zirconium, among which chromium or zirconium is preferred. The metal layer 24 is formed by sputtering, and reaction conditions of sputtering, for example, pressure intensity, airflow ratio, power and so on, may be controlled so that the metal layer 24 has tensile stress.

As for a PMOS transistor, the metal layer 24 has compressive stress and has material of aluminum, tantalum or zirconium, among which β-tantalum is preferred. A method for forming the metal layer 24 comprises: forming a β-tantalum thin film by sputtering, wherein the β-tantalum thin film has compressive stress by adjusting reaction conditions, such as pressure intensity, power and so on; performing thermal treatment on the β-tantalum thin film. The thermal treatment comprises heating the β-tantalum thin film to a temperature in a range of about 380 to about 420 degree Celsius, and the heating speed is about 8 to about 12 degrees Celsius per minute. Thermal treatment may reinforce compressive stress of the β-tantalum thin film. To achieve larger compressive stress, the thermal treatment comprises a heating process repeated at least once, for example three times or seven times. In a specific embodiment, compressive stress of the β-tantalum thin film which is formed by sputtering is about −1 to about −4 GPa, and compressive stress increases to about −6 to about −7 GPa after the heating process is repeated for seven times.

Referring to FIG. 6, anisotropic etch is performed respectively on the metal layer and the isolation dielectric layer. Metal layers on the semiconductor substrate 20 and the gate stack 22 are removed. L-shaped spacers 23a and sacrificial metal spacers 24a are respectively formed on side walls of the gate stack 22. The L-shaped spacers 23a are provided between the sacrificial metal spacers 24a and the gate stack 22 and between the sacrificial metal spacers 24a and the semiconductor substrate 20. The anisotropic etch comprises dry etch. The sacrificial metal spacers 24a are provided on side walls of the gate stack 22, and in the subsequent annealing and thermal treatment, absorb oxygen in the gate dielectric layer 22a, and oxygen in the interface oxide layer 10 which are formed between the gate dielectric layer 22a and the semiconductor substrate 20, reducing the equivalent oxide thickness and impact on the work function, facilitating reduction of the equivalent oxide thickness of the gate dielectric layer of the overall MOS transistor, and maintaining consistence of the device performance parameters. Moreover, the sacrificial metal spacers 24a have stress after oxidation. As for an NMOS transistor, tensile stress along a length of the channel exists, and as for a PMOS transistor, compressive stress along a length of the channel exists, promoting mobility of the carriers and device performance. It is uncertain that the sacrificial metal spacers 24a are oxidized to the metal oxide dielectric completely after absorbing oxygen. The L-shaped spacers 23a isolate the sacrificial metal spacers 24a and the gate electrode 22a. In one embodiment, formation of the L-shaped spacers 23a is optional. In one embodiment, the sacrificial metal spacers 24a are formed directly on the semiconductor substrate 20 and on side walls of the gate stack 22.

Figure 7:
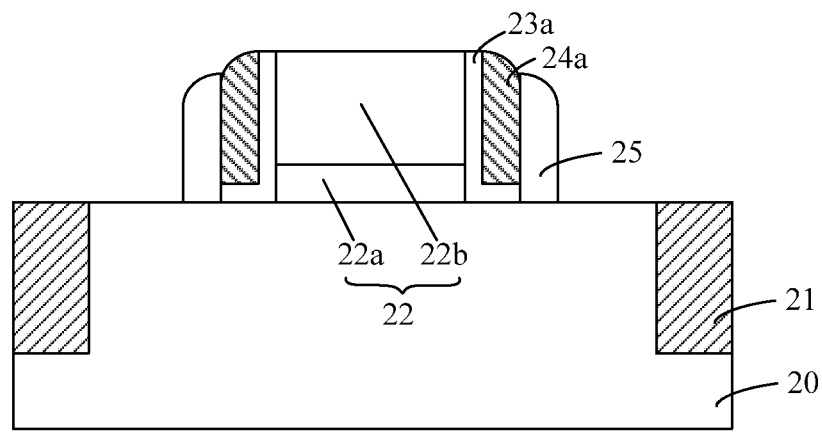

Referring to FIG. 7, after the sacrificial metal spacers 24a are formed, dielectric spacers 25 are formed on outer sidewalls of the sacrificial metal spacers 24a on the semiconductor substrate 20. The dielectric spacers 25 are made of silicon oxide, silicon nitride, or a combination thereof. A method for forming the dielectric spacers 25 comprises: forming a dielectric material layer by chemical vapor deposition (CVD) for covering the semiconductor substrate 20, the gate stack 22 and side walls of the sacrificial metal spacers 24a; selectively etching back the dielectric material layer and removing the dielectric material layer on the semiconductor substrate 20 and the gate stack 22 for forming dielectric spacers 25 on outer sidewalls of the sacrificial metal spacers 24a. The dielectric spacers 25 are adapted to protect the sacrificial metal spacers 24a. In one embodiment, formation of the dielectric spacers 25 is optional. In one embodiment, the dielectric spacers 25 are not provided.

It is noted that a process for forming the dielectric spacers 25, for example chemical vapor deposition and etching back, comprises thermal treatment, for example heating the semiconductor substrate 20. In the process of thermal treatment, the sacrificial metal spacers 24a absorb oxygen and are gradually oxidated, reducing the equivalent oxide thickness.

Figure 8:
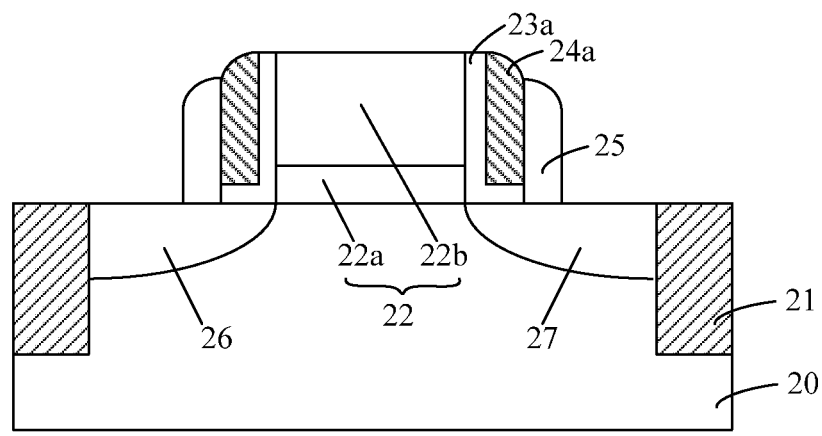

Referring to FIGS. 2 and 8, the step S24 is performed. A source region and a drain region are respectively formed on opposite sides of the semiconductor substrate. Specifically, by means of ion implantation, a source region 26 and a drain region 27 are respectively formed on opposite sides of the gate stack 22 on the semiconductor substrate 20. Those skilled in the art shall understand that formation of the source region 26 and the drain region 27 is not limited within the described above, for example, performing a light dopant ion implantation to the semiconductor substrate 20 on opposite sides of the gate stack 22 before formation of the L-shaped spacers 23a, the sacrificial metal spacers 24a and the dielectric spacers 25. The light dopant ion implantation is performed with low implant dose to form a light dopant implant region. Ions of the light dopant ion implantation are of a type depending on a type of the MOS transistor. After the L-shaped spacers 23a, the sacrificial metal spacers 24a and the dielectric spacers 25 are formed, source/drain implantation is performed to form a source region 26 and a drain region 27. Ions of the source/drain implantation are of a type depending on a type of the MOS transistor and as the same as the type of ions of the light dopant ion implantation.

After the source region 26 and the drain region 27 are formed, the semiconductor substrate 20 is annealed so that the ions in the source region 26 and the drain region 27 are activated, and the sacrificial metal spacers 24a absorb oxygen so as to reduce the equivalent oxide thickness. The reaction conditions of the annealing may be controllable to maintain stress of the sacrificial metal spacers 24a after oxidation. As for NMOS transistor, the sacrificial metal spacers 24a after oxidation retain tensile stress, while as for PMOS transistor, the sacrificial metal spacers 24a, which have stress before oxidation, remain compressive stress after oxidation.

Referring to FIG. 9, a stress layer 28 is formed on the MOS transistor for further promoting carrier mobility and improving device performance. Specifically, in one embodiment, as for PMOS transistor, the stress layer 28 comprises a compressive stress layer 28 for covering the semiconductor substrate 20, the gate stack 22, the L-shaped spacers 23a, the sacrificial metal spacers 24a and the dielectric spacers 25. The compressive stress layer 28 is made of material with pressure tress, for example, silicon oxide, tantalum oxide, zirconium oxide and etc. In another embodiment, as for an NMOS transistor, the stress layer 28 comprises a tensile stress layer 28 for covering the semiconductor substrate 20, the gate stack 22, the L-shaped spacers 23a, the sacrificial metal spacers 24a and the dielectric spacers 25. The tensile stress layer 28 is made of material with tensile stress, for example, silicon nitride, aluminum oxide, chromium oxide, and zirconium oxide. The tensile stress layer 28 produces stress along the length of the channel so as to raise carrier mobility. Similarly, in other relevant thermal treatment, the sacrificial metal spacers 24a, which have stress before oxidation, remain stress after oxidation.

As shown in FIG. 9, the MOS transistor of the first embodiment comprises: a semiconductor substrate 20; a gate stack 22 on the semiconductor substrate 20, and including a gate dielectric layer 22a and a gate electrode 22b on the semiconductor substrate 20 in sequence; a source region 26 and a drain region 27, respectively at opposite sides of the gate stack 22 and in the semiconductor 20; sacrificial metal spacers 24a on sidewalls of the gate stack 22, and having tensile stress or compressive stress, the sacrificial metal spacers 24a having tensile stress when the MOS transistor comprises a NMOS transistor, and the sacrificial metal spacers 24a having compressive stress when the MOS transistor comprises a PMOS transistor. The MOS transistor further comprises: L-shaped spacers 23a located between the sacrificial metal spacers 24a and the semiconductor substrate 20 and between the sacrificial metal spacers 24a and the semiconductor substrate 20; dielectric spacers 25 on outer sidewalls of the sacrificial metal spacers 24a on the semiconductor substrate 20; and a stress layer 28 for covering the semiconductor substrate 20, the gate stack 22, the L-shaped spacers 23a, the sacrificial metal spacers 24a and the dielectric spacers 25. As for an NMOS transistor, the stress layer 28 comprises a tensile stress layer; and as for a PMOS transistor, the stress layer 28 comprises a compressive stress layer.

In other specific embodiments, a NMOS transistor and a PMOS transistor are both formed on the semiconductor substrate. The NMOS transistor and the PMOS transistor have gate stacks, and sacrificial metal spacers respectively on opposite side walls of the gate stacks and having stress with types according to types of the MOS transistor. The NMOS transistor has tensile stress thereon, and the PMOS transistor has compressive stress thereon, thereby further promoting carrier mobility.

The Second Embodiment

FIG. 10 is a schematic flow chart of the method for forming a MOS transistor according to the second embodiment of the present invention. A gate-last process is applied in the method of the second embodiment, as shown in FIG. 10. The method comprises:

Step S31, providing a semiconductor substrate. A dielectric layer is formed on the semiconductor substrate, and defining an opening therein for exposing the semiconductor substrate. A source region and a drain region are respectively formed on the semiconductor substrate and at both sides of the opening.

Step S32, forming sacrificial metal spacers on both sides of the opening, the sacrificial metal spacers having tensile stress or compressive stress;

Step S33, forming a gate dielectric layer for covering the sacrificial metal spacers, and the semiconductor substrate which is exposed at the opening;

Step S24, filling a gate electrode in the opening.

FIGS. 11-16 are cross-sectional views of intermediate structure of the MOS transistor according to a method for forming a MOS transistor of the second embodiment of the present invention.

Figure 11:
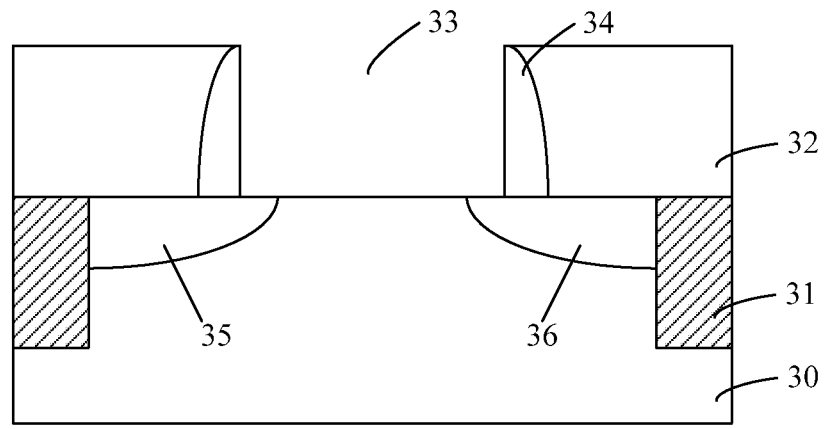
FIGS. 11-16 are cross-sectional views of intermediate structure of the MOS transistor according to a method for forming a MOS transistor of the second embodiment of the present invention.

In combination with FIGS. 10 and 11, the step S31 is performed. A semiconductor substrate is provided. A dielectric layer is formed on the semiconductor substrate, and defines an opening therein for exposing the semiconductor substrate. A source region and a drain region are respectively formed on the semiconductor substrate and at both sides of the opening. Specifically, a semiconductor substrate 30 is provided. A dielectric layer 32 is formed on the semiconductor substrate 30, and defines an opening 33 therein for exposing the semiconductor substrate 30. A source region 35 and a drain region 36 are respectively formed on the semiconductor substrate 30 and at both sides of the opening 33.

The semiconductor substrate 30 may be a silicon substrate, a silicon germanium substrate, a III-V group compound substrate, a silicon carbide substrate or a laminated structure thereof, a silicon on insulator, a diamond substrate, or any other semiconductor substrates known to those skilled in the art. In one embodiment, the semiconductor substrate 30 is a silicon substrate forming isolation structures 31 therein. The isolation structures 31 may be a shallow trench isolation structure, or any other structure for isolating devices or active regions, which are well known to those skilled in the art.

The opening 33 may be formed by a method comprising the normal gate-last process, for example, removing a dummy gate structure of the dielectric layer 32 for forming the opening 33. In the embodiment, dielectric spacers 34 are formed in the dielectric layer 32 and at both sides of the opening 33. Material of the dielectric spacers 34 comprises silicon oxide, silicon nitride or a combination thereof. Similar to the first embodiment, an interface oxide layer is formed in a bottom of the opening 33 and on a surface of the semiconductor substrate 30.

Figure 12:
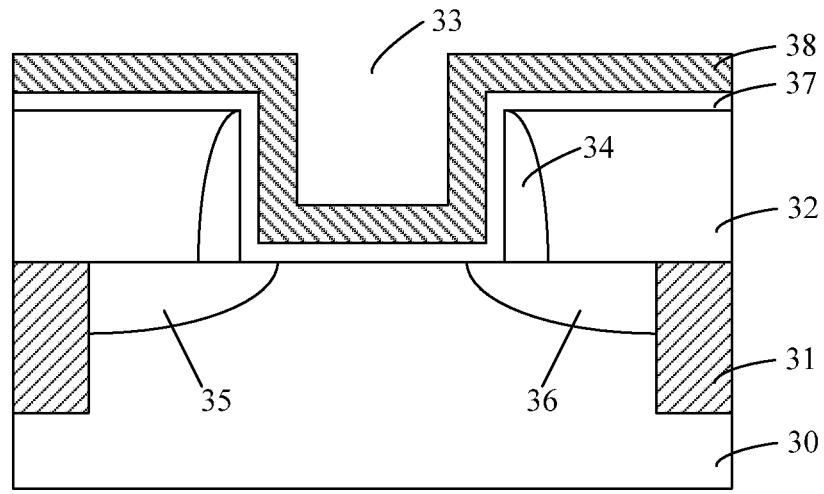
Figure 13:
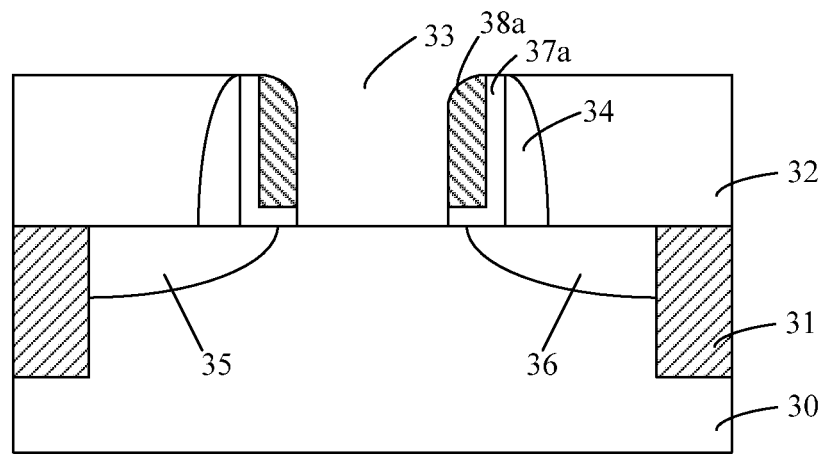

Referring to FIGS. 10, 12 and 13, the step S32 is performed. Sacrificial metal spacers are formed on both sides of the opening, and have tensile stress or compressive stress.

Specifically, referring to FIG. 12, an isolation dielectric layer 37 and a metal layer 38 are respectively formed in sequence. The isolation dielectric layer 37 covers the dielectric layer 32, and inner walls and a bottom of the opening 33. The metal layer 38 is formed on the isolation dielectric layer 37. Material of the isolation dielectric layer 37 comprises silicon oxide, silicon nitride or the like.

The metal layer 38 has stress. According to a type of the MOS transistor, for example, as for a NMOS transistor, the metal layer 38 has tensile stress. Material of the metal layer 38 comprises aluminum, chromium, zirconium or the like. Preferably, material of the metal layer 38 comprises chromium or zirconium by sputtering. The reaction conditions of sputtering, for example, pressure intensity, power and so on, may be controlled so that the metal layer 38 has tensile stress.

As for a PMOS transistor, the metal layer 38 has compressive stress. Material of the metal layer 38 comprises aluminum, tantalum or zirconium, among which β-tantalum is preferred. A manufacture method comprises: forming a β-tantalum thin film by sputtering, wherein the β-tantalum thin film has compressive stress by controlling reaction conditions, such as pressure intensity, power and so on; performing a thermal treatment on the β-tantalum thin film. The thermal treatment comprises heating the β-tantalum thin film to a temperature in a range of about 380 to about 420 degree Celsius, and the heating speed is about 8 to about 12 degrees Celsius per minute. Thermal treatment may reinforce compressive stress of the β-tantalum thin film. To achieve larger pressure intensity, the thermal treatment comprises a heating process repeated at least once, for example three times, or seven times. In a specific embodiment, compressive stress of the β-tantalum thin film which is formed by sputtering is about −1 to about −4 GPa, and compressive stress increases to about −6 to about −7 GPa after the heating process is repeated for seven times.

Referring to FIG. 13, anisotropic etch is performed on the metal layer for removing a part of the metal layer, which is in a bottom of the opening 33 and on a surface of the dielectric layer 32, for forming sacrificial metal spacers 38a. After formation of the sacrificial metal spacers 38a, the isolation dielectric layer is etched for removing a part of the isolation dielectric layer which is on a bottom of the opening 33 and on a surface of the dielectric layer 32. Remaining part of the isolation dielectric layer forms L-shaped spacers 37a, which are located between the sacrificial metal spacers 38a and the dielectric spacers 34 and between the sacrificial metal spacers 38a and the semiconductor substrate 30. During subsequent process of removing oxygen, the sacrificial metal spacers 38a may not be oxidized completely. For example, the L-shaped spacers 37a may isolate the sacrificial metal spacers 38a and the source region 35 and the drain region 36 for preventing from short.

In other specific embodiment, the sacrificial metal spacers 38a are directly formed on side walls of the openings 33 and the semiconductor substrate 30, instead of providing the L-shaped spacers 37a.

Figure 14:
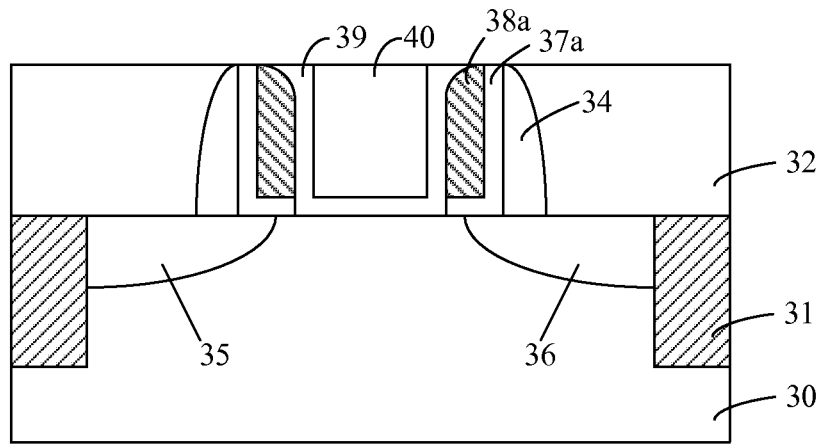
Figure 15:
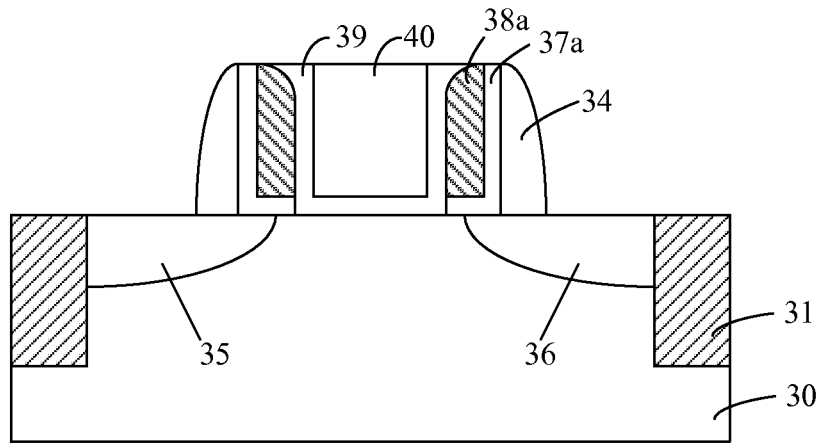

Referring to FIGS. 10 and 14, the step S33 and S34 are performed. A gate dielectric layer is formed for covering the sacrificial metal spacers 38a and a part of the semiconductor 30 which is located in the opening 33. A gate electrode 40 is filled in the opening 33. A gate stack of the second embodiment comprises the gate electric layer 39 and the gate electrode 40. In this embodiment, material of the gate dielectric layer 39 is high K material, for example, $HfO_2$, $ZrO_2$, $La_2O_3$, or other high K material well known to those skilled in the art. Material of the gate electrode 40 is metal or other conductive material, for example, Ti, Ni, Al, W, or other conductive material which can be used as gate electrode and are well known to those skilled in the art, for example TiN, TiAlN or the like.

After formation of the gate dielectric layer 39, the semiconductor substrate 30 is annealed, so that the sacrificial metal spacers 38a absorb oxygen in the interface oxide layer and oxygen in the gate dielectric layer 39. Similar to the first embodiment, the sacrificial metal spacers 38a, which have stress before oxidation, remain stress after annealing and other thermal treatment.

In a preferred embodiment, a stress layer is formed on the MOS transistor. Specifically, referring to FIGS. 15 and 16, the dielectric layer is removed. A stress layer 41 is formed for covering the semiconductor substrate 30, the sacrificial metal spacers 38a, the gate electrode 40, the gate dielectric layer 39, the L-shaped spacers 37a and the dielectric spacers 34. According to a type of the MOS transistor, as for a NMOS transistor, the stress layer 41 comprises a tensile stress layer, and material of the stress layer 41 comprises silicon nitride, aluminum oxide, chromium oxide, zirconium oxide or the like. As for a PMOS transistor, the stress layer 41 comprises a compressive stress layer, and material of the stress layer 41 comprises silicon nitride, tantalum oxide, zirconium oxide or the like.

Figure 16:
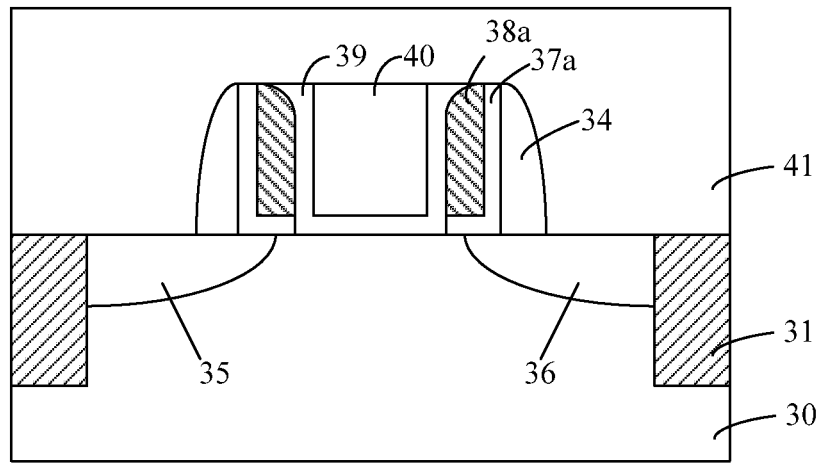

As shown in FIG. 16, the MOS transistor of the second embodiment comprises: a semiconductor substrate 30; a gate stack on the semiconductor substrate 30, and including a gate dielectric layer 39 and a gate electrode 40 on the gate dielectric layer 39; a source region 35 and a drain region 36, respectively at sidewalls of the gate stack and in the semiconductor 30; sacrificial metal spacers 38 on sidewalls of the gate stack, and having tensile stress or compressive stress, the sacrificial metal spacers 38 having tensile stress when the MOS transistor comprises a NMOS transistor, and the sacrificial metal spacers 38 having compressive stress when the MOS transistor comprises a PMOS transistor. The MOS transistor further comprises: dielectric spacers 34 on outer sidewalls of the sacrificial metal spacers 38, L-shaped spacers 37 located between the sacrificial metal spacers 38a and the dielectric spacers 34 and between the sacrificial metal spacers 38a and the semiconductor substrate 30. A stress layer 41 is provided for covering the MOS transistor. The stress layer 41 comprises a tensile stress layer when the MOS transistor comprises an NMOS transistor; and the stress layer 41 comprises a compressive stress layer when the MOS transistor comprises a PMOS transistor.

In other specific embodiments, a NMOS transistor and a PMOS transistor are both formed on the semiconductor substrate. The NMOS transistor and the PMOS transistor respectively have gate stacks, and sacrificial metal spacers respectively on opposite side walls of the gate stacks. The sacrificial metal spacers have stress which is of type subject to a type of the MOS transistor. Moreover, the NMOS transistor has tensile stress, and the PMOS transistor has compressive stress, thereby further promoting carrier mobility.

According to one embodiment of the present invention, sacrificial metal spacers are formed on sidewalls of the gate stack to absorb oxygen of the gate stack, thereby obviating the problems in prior art, for example, increasing the equivalent oxide thickness and deteriorating uniformity of device performance. The sacrificial metal spacers have stress for promoting carrier mobility of MOS transistor and improving device performance.

Further, the invention is adapted for gate-first and gate-last, and therefore facilitates process integration and promotes industrial applicability.

The invention is disclosed, but not limited, by preferred embodiment as above. Based on the disclosure of the invention, those skilled in the art shall make any variation and modification without deviation from the scope of the invention. Therefore, any simple modification, variation and polishing based on the embodiments described herein belongs to the scope of the invention.

What is claimed is:

1. A MOS transistor comprising:
    a semiconductor substrate;
        a gate stack located on the semiconductor substrate, and including a gate dielectric layer and a gate electrode arranged on the semiconductor substrate in sequence;
        a source region and a drain region located in the semiconductor substrate and at opposite sides of the gate stack; and
        sacrificial metal spacers located on sidewalls of the gate stack, and having tensile stress or compressive stress.

2. The MOS transistor according to claim 1, wherein the MOS transistor comprises an NMOS transistor, and the sacrificial metal spacers have tensile stress.

3. The MOS transistor according to claim 2, wherein material of the sacrificial metal spacers comprises aluminum, chromium, zirconium, aluminum oxide, chromium oxide or zirconium oxide.

4. The MOS transistor according to claim 1, wherein the MOS transistor comprises a PMOS transistor, and the sacrificial metal spacers have compressive stress.

5. The MOS transistor according to claim 4, wherein material of the sacrificial metal spacers comprises aluminum, tantalum, zirconium, aluminum oxide, tantalum oxide or zirconium oxide.

6. The MOS transistor according to claim 1, further comprising:
    L-shaped spacers located between the sacrificial metal spacers and the gate stack and between the sacrificial metal spacers and the semiconductor substrate.

7. The MOS transistor according to claim 1, further comprising: dielectric spacers located on outer sidewalls of the sacrificial metal spacers on the semiconductor substrate.

8. The MOS transistor according to claim 7, further comprising:
    L-shaped spacers located between the dielectric spacers and the sacrificial metal spacers and between the sacrificial metal spacers and the semiconductor substrate.

9. A method for forming MOS transistor, comprising:
    providing a semiconductor substrate;
    forming a gate stack on the semiconductor substrate, and the gate stack including a gate dielectric layer and a gate electrode arranged on the semiconductor substrate in sequence;
    forming sacrificial metal spacers on sidewalls of the gate stack, and the gate stack having tensile stress or compressive stress; and
    forming a source region and a drain region, respectively in the semiconductor substrate and at opposite sides of the gate stack.

10. The method according to claim 9, wherein forming sacrificial metal spacers on sidewalls of the gate stack comprising:
    forming a metal layer for covering a surface of the semiconductor substrate, and a surface and sidewalls of the gate stack; and
    anisotropically etching the metal layer, removing a part of the metal layer, which are on a surface of the semiconductor substrate and a surface of the gate stack, for forming the sacrificial metal spacers on sidewalls of the gate stack.

11. The method according to claim 10, further comprising: before forming the metal layer,
    forming an isolation dielectric layer for covering a surface of the semiconductor substrate and a surface and sidewalls of the gate stack, the metal layer being located above the isolation dielectric layer; and
    after anisotropically etching the metal layer,
    anisotropically etching the isolation dielectric layer, and removing the isolation dielectric layer on a surface of the gate stack and a surface of the semiconductor substrate for forming L-shaped spacers between the sacrificial metal spacers and the gate stack and between the sacrificial metal spacers and the semiconductor substrate.

12. The method according to claim 10, wherein the MOS transistor comprises NMOS transistor, and the metal layer has tensile stress.

13. The method according to claim 12, wherein material of the sacrificial metal spacers comprises aluminum, chromium or zirconium.

14. The method according to claim 10, wherein the MOS transistor comprises PMOS transistor, and the metal layer has compressive stress.

15. The method according to claim 14, wherein material of the sacrificial metal spacers comprises aluminum, tantalum or zirconium.

16. The method according to claim 9, further comprising:
    after forming the sacrificial metal spacers and before forming the source region and the drain region,
    forming dielectric spacers on outer sidewalls of the sacrificial metal spacers on the semiconductor substrate.

17. A method for forming a semiconductor device, comprising:
    providing a semiconductor substrate with a dielectric layer thereon, the dielectric layer defining an opening therein for exposing the semiconductor substrate on a bottom thereof, a source region and a drain region being respectively formed on the semiconductor substrate and at both sides of the opening;

forming sacrificial metal spacers on both sides of the opening, the sacrificial metal spacers having tensile stress or compressive stress;

forming a gate dielectric layer for covering the sacrificial metal spacers, and the semiconductor substrate which is exposed at the bottom of the opening; and filling a gate electrode in the opening.

18. The method according to claim 17, wherein forming sacrificial metal spacers on both sides of the opening, comprising:

forming a metal layer for covering a surface of the dielectric layer, and a bottom and sidewalls of the opening;

anisotropically etching the metal layer, removing a part of the metal layer on a surface of the dielectric layer and at the bottom of the opening for forming the sacrificial metal spacers on sidewalls of the opening.

19. The method according to claim 18, wherein the MOS transistor comprises NMOS transistor, and the metal layer has tensile stress.

20. The method according to claim 19, wherein material of the sacrificial metal spacers comprises aluminum, chromium or zirconium.

21. The method according to claim 18, wherein the MOS transistor comprises PMOS transistor, and the metal layer has compressive stress.

22. The method according to claim 21, wherein material of the sacrificial metal spacers comprises aluminum, tantalum or zirconium.

23. The method according to claim 18, further comprising:

before forming the metal layer, forming an isolation dielectric layer for covering a surface of the dielectric layer, and a bottom and sidewalls of the opening, the metal layer being formed on the isolation dielectric layer; and after anisotropically etching the metal layer for forming the sacrificial metal spacers, etching the isolation dielectric layer, and removing the isolation dielectric layer on a surface of the dielectric layer and on a bottom of the opening for forming L-shaped spacers between the sacrificial metal spacers and the dielectric layer and between the sacrificial metal spacers and the semiconductor substrate.

* * * * *